United States Patent [19]
Kaneko et al.

[11] Patent Number: 5,170,227
[45] Date of Patent: Dec. 8, 1992

[54] MASK ROM HAVING MONOCRYSTALLINE SILICON CONDUCTORS

[75] Inventors: Masahide Kaneko; Kenji Noguchi, both of Hyogo, Japan

[73] Assignee: Mitsubishi Denki Kabushiki Kaisha, Tokyo, Japan

[21] Appl. No.: 493,540

[22] Filed: Mar. 14, 1990

[30] Foreign Application Priority Data

Mar. 20, 1989 [JP] Japan .................. 1-68006

[51] Int. Cl.⁵ .................. H01L 27/12; H01L 27/02; H01L 45/00
[52] U.S. Cl. .................. 257/67; 257/70; 257/910
[58] Field of Search .................. 357/4, 40, 14, 23.1, 357/71, 91

[56] References Cited

U.S. PATENT DOCUMENTS

| | | |
|---|---|---|
| 4,214,918 | 7/1980 | Gat et al. |
| 4,448,632 | 5/1984 | Akasaka .................. 256/603 |
| 4,503,315 | 5/1985 | Kamioka et al. .................. 219/121 LE |

FOREIGN PATENT DOCUMENTS

| | | |
|---|---|---|
| 56186 | 7/1982 | Fed. Rep. of Germany . |
| 61-1904 | 1/1986 | Japan . |

OTHER PUBLICATIONS

Charschan, *Lasers in Industry*, Western Electric series, pp. 299-309, Van Nostrand Reinhold Company, NY, 1972.

Elektronick, 1988, pp. 83-86 (with a translation of relevant parts of the reference).

*Primary Examiner*—J. Carroll
*Attorney, Agent, or Firm*—Lowe, Price, LeBlanc & Becker

[57] ABSTRACT

A method for producing a mask ROM having an array of memory cells in which pn junctions obtained by introducing P-type impurities by ion implantation onto the surface of an N-type electrically conductive layers obtained in turn by introducing N-type impurities into the polysilicon layers are formed as memory cells in a matrix configuration. The polysilicon layers that are to be rendered into the N-type electrically conductive layers are previously monocrystallized by laser annealing. In this manner, the N-type electrically conductive layers into which P-type impurities are introduced by ion implantation at the time of formation of the pn junction are turned into a monocrystalline layer so that the surface of the N-type electrically conductive layers may be uniformly and easily converted into the P-type by this ion implantation. In short, the junction surface of the pn junction used as the memory cell becomes uniform. In this manner, the memory cell having desirable pn junction properties, that is, suited for practical application, may be produced easily.

5 Claims, 7 Drawing Sheets

WORD LINE

BIT LINE

FIG.7 PRIOR ART

ISLAND FORMATION
↓
FIELD OXIDATION
↓
GATE FORMATION (INCLUDING OF RENDERING THE LAYERS INTO N-TYPE)
↓
FORMATION OF N-CHANNEL/P-CHANNEL SOURCE·DRAIN
↓
FORMATION OF SMOOTH COAT FILM
↓
FORMATION OF CONTACT HOLES
↓
IMPLANTATION (FORMATION OF THE P-TYPE REGION)
↓ (FORMATION OF ELECTRICALLY CONDUCTIVE LAYERS)
FORMATION OF PROTECTIVE FILM

MASK ROM HAVING MONOCRYSTALLINE SILICON CONDUCTORS

BACKGROUND OF THE INVENTION

1. Field of the Invention

This invention relates generally to a method for producing a mask ROM and, more particularly, to an improved method for manufacturing the memory cell array portion and a mask ROM produced by this method.

2. Description of the Background Art

Memory integrated circuits currently in use may be roughly classified according to their writing function into a read/write memory or RWM in which not only readout but also free writing may be made after completion of manufacture, and a read only memory or ROM in which writing cannot be made and which is used only for readout after completion of manufacture. The ROM is used for storage of fixed information, such as character patterns, since the information stored therein remains unerased after power is turned off. The ROM may be further classified into an erasable and programmable ROM or EPROM in which the stored information can be modified electrically after completion of manufacture and in which the stored information can be erased by, for example, irradiation of ultraviolet rays, and a mask ROM in which the information is written in the course of manufacture and the stored information cannot be modified after completion of manufacture. The mask ROM is employed for storage of fixed data such as character patterns in a CRT display or the BASIC program for a personal computer.

The memory part of the currently commercialized mask ROM includes in general a large number of MOS transistors arranged in a matrix configuration. Each of these MOS transistors is used as a memory cell. When a MOS transistor is formed on a semiconductor substrate, it becomes necessary to provide three regions, that is, source, drain and gate regions. It is necessary for the size of each of these three regions to be large enough to achieve the function as the MOS transistor; so that it cannot be reduced in size infinitesimally. Hence, despite the recent demand for miniaturization of semiconductor integrated circuit devices, there are naturally imposed limitations on miniaturization of the area of the memory part in its entirety, as long as MOS transistors are used as the memory cells. This problem becomes most serious particularly with increase in the storage capacity of the mask ROM. On the other hand, the demand for a larger memory capacity of the IC memory inclusive of the mask ROM has become more remarkable in recent years. Thus an improved mask ROM has already been proposed for meeting the contradictory demands for miniaturization of a variety of semiconductor integrated devices, inclusive of IC memories, and the larger storage capacities of the IC memories. In such an improved mask ROM, a device or element having a diode construction is used as a memory cell in place of a device or element having a MOS transistor configuration.

Figure 6A:
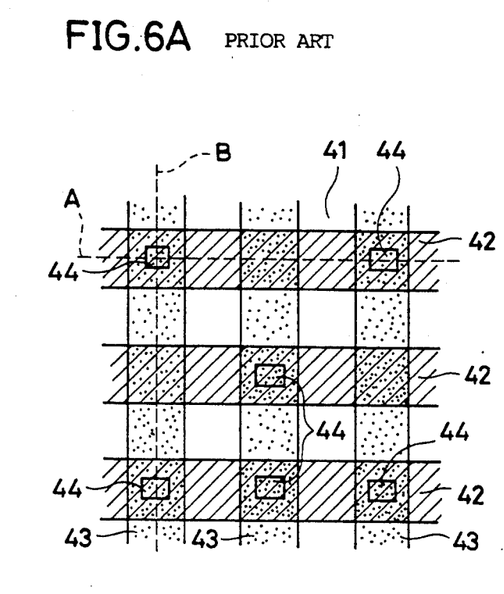
FIG. 6A is a plan view showing a memory cell array of a mask ROM shown in the Japanese Patent Publication No. 61-1904.
Figure 6B:
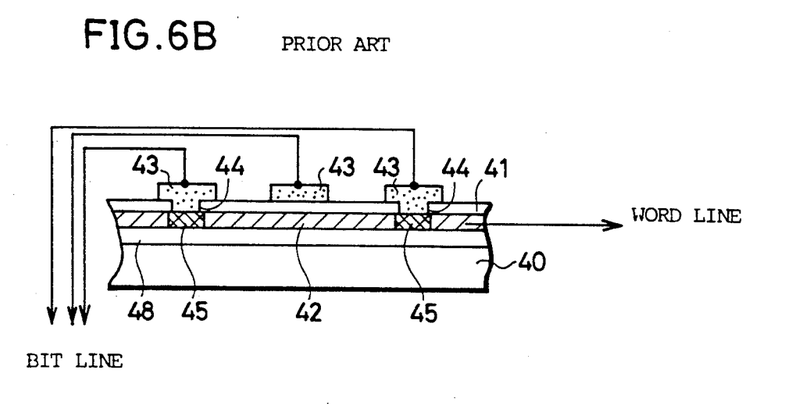
FIGS. 6B and 6C are cross sectional views taken along two different directions of a memory cell array of a conventional mask ROM.
Figure 6C:
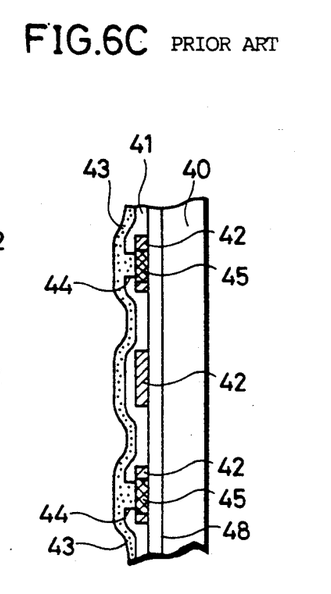

FIGS. 6A to 6C show the structure of a memory cell array of an improved mask ROM disclosed in the Japanese Patent Publication No. 61-1904. FIG. 6A is a plan view of the memory cell array and FIGS. 6B and 6C are cross sectional views taken along dotted lines (a) and (b) of FIG. 6A, respectively. Referring to these figures, this memory cell array is formed on a monocrystalline silicon semiconductor substrate 40. An insulating film 48 formed by a silicon oxide film, is formed on the surface of the substrate 40. A large number of band-like N-type polysilicon layers 42 are formed in parallel with one another on this substrate 40. An insulating layer 41 is formed on the overall surface of the semiconductor substrate 40, inclusive of the polysilicon layers 42, and openings or contact holes 44 are selectively formed in the insulating layer 41. P-type polysilicon regions 45 are formed by introducing impurities into the polysilicon layers 42 below these contact holes 44. A large number of parallel band-like electrically conductive layers 43 are formed on the insulating layer 41 and on the contact holes 44 for intersecting the polysilicon layers 42. These contact holes 44 are selectively formed at the points of intersection of the polysilicon layers 42 and the electrically conductive layers 43. Each of the band-like polysilicon layers 42 corresponds to each word line and each of the band-like electrically conductive layers 43 corresponds to each bit line.

As may be seen from FIG. 6A, the points of intersection between the band-like polysilicon layers 42 and the band-like electrically conductive layers form a matrix. Referring to FIGS. 6B and 6C, pn junctions are formed in the polysilicon layers 42 below the contact holes 44 only at those points of intersection associated with the contact holes 44. Therefore, when a forward voltage is applied to the electrically conductive layers 43 having the points of intersection associated with the contact holes 44, the current flows in the associated polysilicon layers 42. On the other hand, when a forward voltage is applied to the electrically conductive layers 43 having the points of intersection not associated with the contact holes 44, no current flows through the polysilicon layers 42 at those points of intersection, since the electrically conductive layers 43 and the polysilicon layers 42 are insulated from each other by the insulating layer 41. Therefore, when a bit line is selected, a predetermined voltage is applied to this bit line and a word line is then selected and checked as to whether or not the current flows in this word line, it can be checked whether or not a contact hole is provided at the point of intersection between the electrically conductive layer 43 associated with the selected bit line and the polysilicon layer 42 associated with the selected word line. Therefore, in the manufacture of the memory cell array of the mask ROM, when the presence or the absence of the contact holes is associated with the logical value "1" or "0", and the formation pattern of the contact holes is selected in dependence upon the information to be stored in the mask ROM, it becomes possible to read out the stored information from the mask ROM after completion of manufacture, as in the conventional device. That is, a single MOS transistor is not used as a memory cell, as a conventional art but simply a pn junction, that is, a diode, is used as the memory cell. Hence, the area required for a memory cell is determined by the widths of the polysilicon layer 42 and the electrically conductive layer 43. The minimum values of the widths of the electrically conductive layers 43 and the polysilicon layers 42 are determined by the limit line-and-space value in the current manufacture technique. Therefore, by reducing these widths, the area occupied by each memory cell on the substrate may be markedly lesser than that of the conventional device, so long as contact holes 44 can be provided. Thus a mask ROM can be provided which is significantly lesser in size than the conventional mask ROM in which a MOS transistor is used as a memory cell.

The process for production of the memory cell array shown in FIG. 6 is explained. First, an oxide film is formed such as by selective oxidation on a monocrystalline silicon substrate on which the memory cell array is to be formed. In this manner, a monocrystalline silicon substrate 40 having an insulating surface layer is formed. A large number of band-like polysilicon layers are formed in parallel to one another on this insulating film. Meanwhile, polysilicon is an intrinsic semiconductor, its conductivity type being neither an N-type or a P-type. Therefore, for rendering the polysilicon layer into an N-type, N-type impurities are introduced into this polysilicon layer. In this manner, a large number of parallel band-like N-type polysilicon layers 42 are produced. An insulating layer 41 is then formed on the overall surface of the substrate 40 inclusive of the surfaces of the N-type polysilicon layers 42. Then, contact holes 44 are formed such as by etching selectively on the insulating layer 41, in dependence upon the information desired to be stored in the mask ROM. Then, P-type impurities are introduced selectively by ion implantation into those regions of the N-type polysilicon layers 42 in which the contact holes 44 are provided. In this manner, P-type polysilicon regions 45 are formed at those portions of the N-type polysilicon layers 42 in which the contact holes 44 are provided. Finally, a large number of parallel band-like electrically conductive layers 43 are formed from, for example, aluminum, on the insulating layer 42 inclusive of the contact holes 44.

Figure 7:
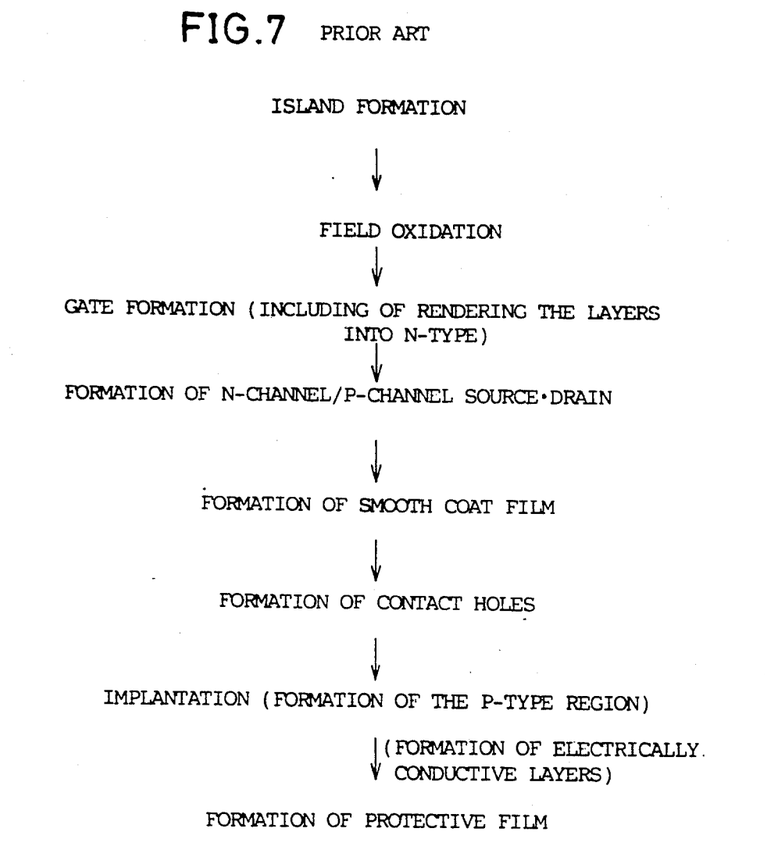
FIG. 7 is a diagrammatic flowchart showing an example of the manufacture process for the conventional mask ROM.

The actual manufacture process of the mask ROM chip having the above described memory cell array is hereinafter explained. FIG. 7 is a flowchart showing the outline of the manufacture process for the mask ROM chip. Referring to this figure, a region or an island of a conductivity type opposite to the conductivity type of a monocrystalline silicon substrate is formed on the monocrystalline silicon substrate. This region may prove to be a region on which the source and drain of the transistor are to be formed in the subsequent process. The substrate is then selectively oxidized for forming a thick insulating film of a field oxidation film for isolating adjacent circuit devices or elements from one another. The polysilicon layers that are to be the gate of the P-channel transistor and the N-channel transistor to be used as the peripheral circuits of the memory cell array and that are to be the word lines of the memory cell array are then formed. The polysilicon layers that are to be the word lines are rendered at this time into the N-type by introducing N-type impurities into these polysilicon layers. The source and the drain regions of the N-channel and P-channel transistors are then formed by selectively introducing impurities onto the substrate surface. An insulating film is then formed on the overall surface of the substrate for smoothing the irregularities on the substrate. This is referred to FIG. 7 as "formation of smooth coat film". Contact holes are then formed selectively in this insulating film. Then, P-type impurities are introduced by ion implantation through these contact holes into the polysilicon layers that are to be the word lines of the memory cell array. This is referred to FIG. 7 as "implantation". In this manner, pn junctions are formed only in the memory cells provided with the contact holes. Then, electrically conductive layers are formed on the substrate inclusive of the contact holes in accordance with the desired wiring pattern. Finally, a glass layer is formed as a protective layer for device protection.

As long as the manufacture process is concerned, the above described mask ROM having a memory cell array making use of a single pn junction as a memory cell presents the following disadvantages.

Figure 9:
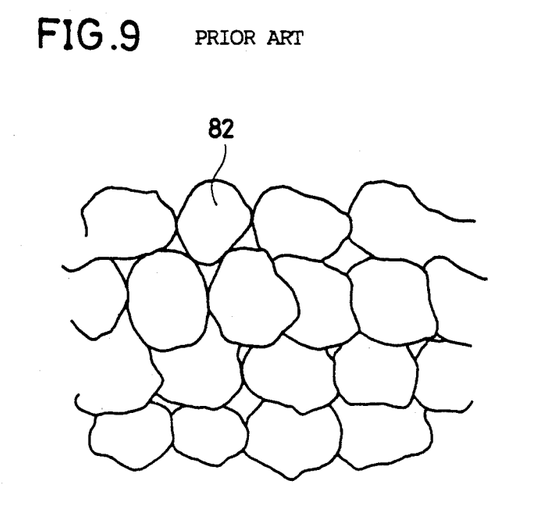
FIG. 9 shows diagrammatically the polysilicon structure.
Figure 10:
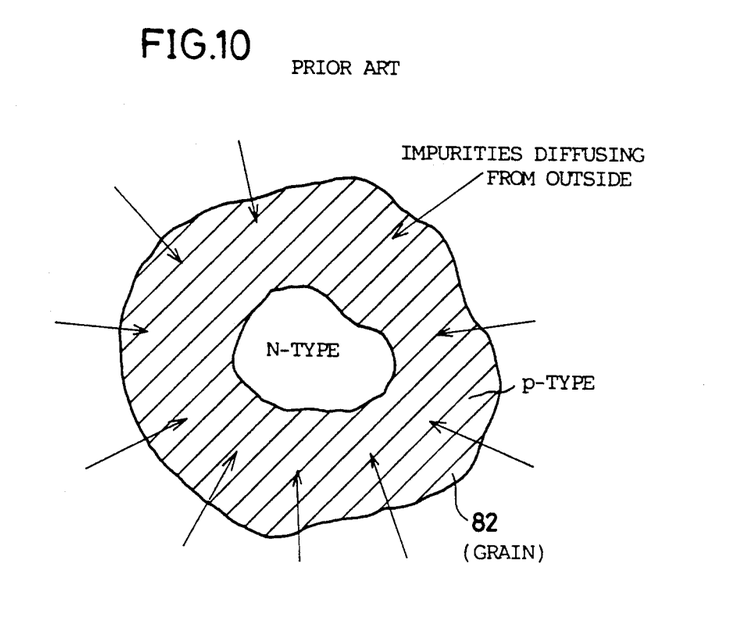
FIG. 10 shows the N-type polysilicon doped with the P-type impurities on the grain level.

The manufacture process of the memory cell array part includes the step of introducing N-type impurities into the polysilicon layer for rendering the polysilicon layer into an N-type, and the step of introducing P-type impurities by ion implantation into the regions of the N-type polysilicon layers provided with the contact holes for rendering these regions into the P-type. When impurities are introduced into the polysilicon which is neither of the N nor of the P conductivity type, for rendering the polysilicon into an N-type, impurities are introduced at a concentration of the order of $10^{14} \sim 10^{16}/cm^2$. On the other hand, when the polysilicon once rendered into the N-type is to be converted into the P-type opposite thereto, impurities are introduced at a concentration of the order of $10^{18} \sim 10^{20}/cm^2$ which is higher than in the case of rendering the polysilicon which is neither of the P-type nor of the N-type into the N-type, since it is necessary to reverse the polarity of the polysilicon once doped with the N-type impurities by introducing P-type impurities into polysilicon. Meanwhile, polysilicon is not formed by homogeneous single crystals, but is an aggregate of particulate materials called grains. FIG. 9 shows the construction of polysilicon highly schematically. In this figure, each of the particles 82 represents each grain making up polysilicon. The state of distribution of impurities introduced into the above described polysilicon structure is not so uniform as in the case of introducing the impurities into the monocrystalline silicon. FIG. 10 shows the state of diffusion of the P-type impurities introduced into the N-type polysilicon, herein thought of as a grain, for rendering the N-type polysilicon into the P-type. It may be seen from this figure that the P-type impurities are diffused from the outside towards the interior of the grain. Therefore, when it is assumed that the grain is rendered uniformly to the N type to its innermost region, those portions of the grain, shown by hatching in the figure, in which the concentration of the P-type impurities is high enough to render the N-type polysilicon into the P-type, are rendered into the P-type, while that portion, shown at near the center of the grain, in which the concentration of the P-type impurities is not so high, remains to be of the N-type. Hence, the polysilicon once rendered into the N-type can not be rendered uniformly into the P-type. Meanwhile, when impurities are introduced into the polysilicon which is neither of the P-type or nor of the N-type to render the polysilicon into the N-type, the above described properties of polysilicon present no particular problems. It is because those regions of the polysilicon doped with impurities are rendered into the N-type in their entirety even if the state of distribution of the impurities in polysilicon, that is, the state of rendering into the N-type of polysilicon, differ slightly with respect to each of the grains.

As described hereinabove, it is difficult to render the polysilicon, once rendered into the N-type, uniformly into the P-type on the grain level. Therefore, when the N-type polysilicon is rendered into the P-type, there is no definite boundary between the region which has been turned into the P-type and the region which remains to be of the N-type. This means that the pn junction, which is most critical as a memory cell, can hardly be formed. Even assuming that the pn junction that may play the role of the diode, that is, the role of the memory cell, the problem of extremely low reverse voltage is still presented because the voltage withstand properties of the pn junction remains markedly inferior to that of the monocrystalline silicon. In this manner, it is difficult to produce a desirable pn junction by the conventional manufacture methods.

Figure 8A:
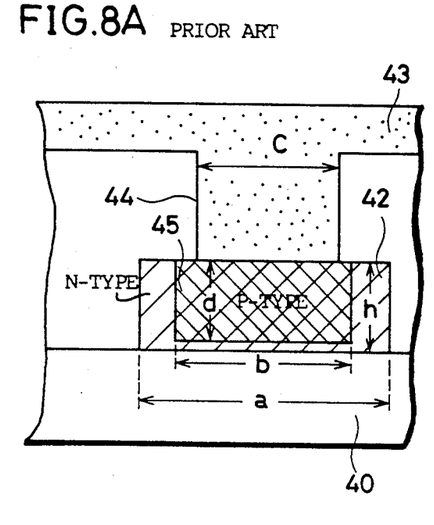
FIGS. 8A and 8B are cross sectional views showing two examples of the memory cell of the mask ROM produced by the conventional manufacture process for the mask ROM.
Figure 8B:
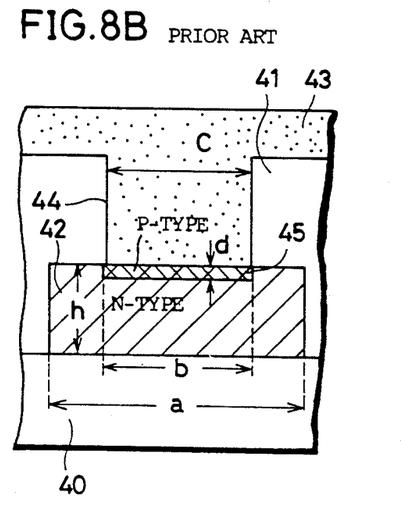

On the other hand, the following constraints are imposed when forming the P-type region in the N-type polysilicon layers that are to be the future word lines. FIGS. 8A and 8B are sectional views of a memory cell having a contact hole. FIGS. 8A and 8B show the P-type regions 45 formed in the N-type polysilicon layers to a deeper and shallower thickness along the direction of the thickness of the N-type polysilicon layer respectively. It is noted that the N-type polysilicon layer 42 is extended in a direction normal to the plane of the drawing sheet. Meanwhile, depending on the presence or absence of the contact hole in the selected memory cell, it is necessary for a sufficient amount of current to flow in the word line corresponding to the memory cell. To this end, a lesser value of the resistance of the word line is preferred. The resistance value of the word line is influenced by the cross-sectional area of the N-type polysilicon layer 42. On the other hand, a partially electrically conductive P-type polysilicon region 45 is formed in the N-type polysilicon layer 42 that is to be the future word line. Therefore, in the region in which the P-type region 45 is formed, that is, in the region below the contact hole, the effective cross sectional area of the N-type polysilicon layer 42 through which the current flows actually is equal to the design cross sectional area $a \times h$, wherein h and a designate the thickness of the N-type polysilicon layer 42 and its width, respectively, less the cross-sectional area of the P-type polysilicon region 45, that is, $d \times b$, wherein d and b designate the thickness and width of the P-type polysilicon region 45, respectively. Therefore, for reducing the resistance value of the word line, the lesser sectional area of the P-type polysilicon region is preferred (see FIGS. 8A and 8B). That is, the lesser values of the thickness d and width b of the P-type polysilicon region 45 are preferred. However, reducing the width c of the contact hole means increasing the contact resistance value between the conductor layer 43 and the N-type polysilicon layer 42, since the width b of the P-type polysilicon region 45 is thought to be about equal to the width c of the contact hole c. On the other hand, if the thickness d of the P-type polysilicon region 45 is too small, the formed pn junction does not play the role of the memory cell. Therefore, when forming the P-type region 45 in the N-type polysilicon layer 42, it is necessary to introduce impurities to a moderate depth in consideration of the above described constraints. On the other hand, the desirable pn junctions can hardly be produced by the conventional manufacture methods, as described hereinabove. Therefore, in consideration of the above constraints, it is extremely difficult to produce the P-type polysilicon region 45 to a suitable depth. For example, when forming the P-type polysilicon region 45, the amount of the P-type impurities to be introduced by ion implantation is increased with a view to raising the concentration of the impurities to produce a sufficiently satisfactory pn junction, it becomes difficult to control the region of implantation. On the other hand, when the energy of ion implantation is increased with a view to increasing the depth of the P-type polysilicon region 45 to some extent, there is a risk that the N-type polysilicon layer 42, the interlayer film 48 or even the substrate 40 may be injured.

In addition, the N-type polysilicon is rendered into the P-type under the conditions of ion implantation such as the energy for ion implantation and the amount of ions to be implanted, which are different from those when the N-type monocrystalline silicon is rendered into the P-type. As a result, the process of producing a mask ROM chip including a memory cell array and any peripheral circuit on the same substrate containing field effect transistors becomes complicated. That is, the step of forming a pn junction at the portion of the word line which is to be the future memory cell and the step of forming source and drain regions of the transistor must be separated from each other, because the source and drain regions of the P-channel transistor are produced by introducing P-type impurities by ion implantation into N-type regions of the monocrystalline silicon substrate while the memory cells are formed by introducing P-type impurities into regions of N-type polysilicon thereby forming two kinds of P-type regions in the N-type region. For this reason, the step of forming the pn junction in the memory cell is necessarily additionally required near the last step in the manufacture process for the mask ROM.

As described hereinabove, the mask ROM employing a single pn junction as a memory cell as shown in FIG. 6A presents various manufacture problems and hence cannot be provided as commercial products without considerable difficulties.

SUMMARY OF THE INVENTION

It is therefore an object of the present invention to provide a method for producing a mask ROM reduced in size that can be commercialized.

It is another object of the present invention to provide a method of producing a mask ROM including pn junctions sufficiently serving as the memory cell.

It is a further object of the present invention to provide a method for producing a mask ROM by which a mask ROM reduced in size that can be commercialized may be produced easily and reliably.

It is a further object of the present invention to provide a ROM having other circuits on the same chip and in which the formations of pn junction of the ROM memory be done simultaneously with a step of formation of such other circuits.

According to the present invention, there is provided a method for producing a mask ROM comprising the steps of forming a plurality of parallel band-like polysilicon layers on a substrate having a planar surface, laser annealing the polysilicon layers for conversion thereof into monocrystallized layers, introducing impurities of a first conductivity type into the monocrystallized layers for forming monocrystalline layers of the first conductivity type, forming an insulator layer on the monocrystalline layers of the first conductivity type, forming openings in the insulator layer in accordance with the information to be stored in the mask ROM, the openings reaching the surfaces of the monocrystalline layers of the first conductivity type, introducing impurities of a second conductivity type of opposite polarity to the first conductivity type through the openings to form regions of the second conductivity type, and forming a plurality of parallel band-like conductive layers in regions of the insulator film including those regions in which the openings are formed, the conductive layers intersecting said monocrystalline layers of said first conductivity type, and said conductive layers connecting to the regions of the second conductivity type in the regions in which said openings are formed.

According to a preferred embodiment, the first conductivity type is the N-type and the second conductivity type is the P-type.

In the above described method for producing the mask ROM according to the present invention, the band-like polysilicon layers in which the pn junctions which are to be the future memory cells are to be formed are previously heat treated with a laser beam, that is, laser-annealed, so as to be formed into monocrystals. Therefore, when producing a second conductivity type region in the band-like polysilicon layers, the prior-art technique consisting in introducing impurities of the second conductivity type into the monocrystalline silicon of the first conductivity by ion implantation for forming the region of the second conductivity type may be adopted without any modifications. This technique, employed for forming the source and the drain regions of the transistor, enables the depth or the width of the second conductivity type region to be controlled satisfactorily during formation of the source and drain regions. Moreover, since the region to be rendered into the second conductivity type is formed by monocrystals, the pn junction having a uniform junction surface in the band-like polysilicon layer may be formed.

According to another preferred embodiment, a method of making a mask-type read only memory having a peripheral circuit having at least a field effect transistor of a first conductivity type channel and having a source and a drain region formed in a substrate, includes the steps of forming an insulator on the substrate, forming first conductors of a semiconductor material of the same conductivity type as the channel of the transistor on the insulator, forming pn junctions at selected locations on the first conductors, and forming second conductors in contact with the pn junctions. The improvement of the step of forming the second conductors in contact with the pn junctions comprises the steps of annealing the first conductors and forming the source and drain regions of the field effect transistor simultaneously with the step of forming the pn junctions by impurity implantation. In this embodiment, it is possible to simultaneously carrying out the formation of the pn junctions of the memory cells and the formation of the source and drain regions of the transistor of the peripheral circuit by monocrystallizing the first conductors forming the memory cells by annealing, that is, by making the first conductors be crystalline layers of the same type as the substrate on which the source and drain regions of the transistor are to be formed. According to this embodiment, the formation of the pn junctions of the memory cells and the formation of the source and drain regions, which are conventionally carried out in the different steps, are carried out in the same step, resulting in the simplified step of making the mask ROM having the peripheral circuit including the transistor.

The mask ROM according to the present invention is produced by the above described method for producing the mask ROM. In one aspect, a mask-type read only memory according to the present invention comprises a substrate, an insulator formed on the substrate, a plurality of first conductors formed on the insulator and having at least a layer of monocrystalline silicon of a first conductivity type at a surface thereof which is remote from the substrate, the conductors having a predetermined cross-sectional area, an insulator layer formed on the conductors and having contact holes selectively formed therein above selected portions of the conductors, a plurality of second conductors formed above and within the contact holes, and impurity implanted regions of a second impurity type and a concentration sufficient to form pn junctions within the first conductors at least at a lower end of the contact holes. The impurity implanted regions have a width determined by the size of the contact holes and a selected depth. The product of the width and depth is selected to be less than a predetermined fraction of the cross-sectional area of the first conductors. Therefore, in the mask ROM according to the present invention, the pn junctions formed at the opening region formed at the points of intersection between the band-like polysilicon layers and the band-like conductive layers may function satisfactorily as the memory cells.

In another aspect, an integrated circuit according to the present invention has a mask-type read only memory and a peripheral circuit containing at least one field effect transistor of a first conductivity type channel and having source and drain regions formed in the monocrystalline substrate. The integrated circuit comprises a monocrystalline silicon substrate, an insulator formed on a portion of the substrate corresponding to the mask-type read only memory. The mask-type read only memory comprises first and second pluralities of elongated conductors to be respectively disposed at an angle to each other so as to define intersection points, and pn junctions disposed between ones of the first and second pluralities of conductors at selected intersections thereof. The first plurality of conductors are disposed on the insulator, and each conductor of the first plurality of conductors is formed to include at least a layer of monocrystalline silicon of the same conductivity type as the channel of the field effect transistor at a surface thereof which is remote from the insulator. The pn junctions of the mask-type read only memory and the source and drain regions of the at least one field effect transistor may be simultaneously formed by impurity implantation.

According to the present invention, as described hereinabove, the mask ROM, which it has been difficult to produce as commercialized products, can be produced easily under the conditions suited for practical application. The mask ROM according to the present invention has been developed with a view to miniaturizing the size and elevating the operational speed of the device. This object may now be positively realized since the mask ROM as above described can be produced under conditions suited for practical application, so that meritorious and significant effects may be attained by the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
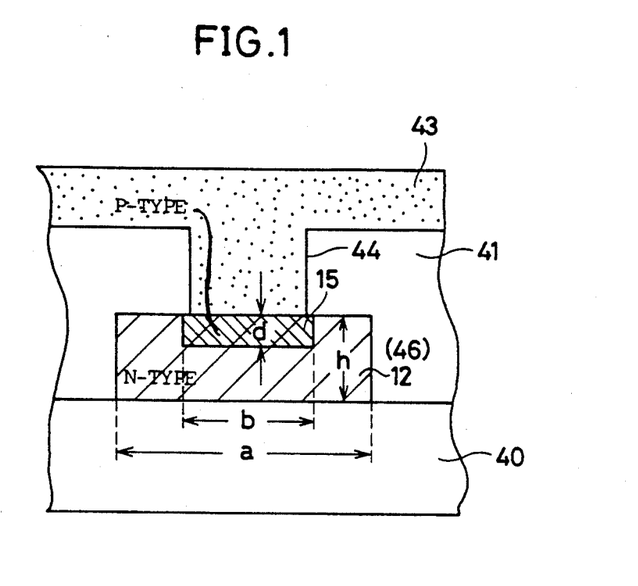
FIG. 1 is a cross sectional view of a memory cell of a mask ROM obtained by the method for producing the mask ROM according to the present invention.

FIG. 1 is a cross sectional view showing a memory cell, provided with a contact hole, of a mask ROM produced by the method for producing the mask ROM according to the present invention. Referring to this figure, the production process for this memory cell is explained. First, an oxide film is formed on a monocrystalline silicon substrate by any known method, such as selective oxidation, for forming a monocrystalline silicon substrate 40 having the insulating film on its surface. A band-like polysilicon layer 46 that is to be the future word line is formed on the planar surface of this monocrystalline silicon substrate 40. Then, in contrast to the conventional practice, the polysilicon layer 46 is heat-treated with the laser light, that is, the layer is laser-annealed, into the form of monocrystals. In this manner, the polysilicon layer 46 is turned into the monocrystalline silicon layer 12. Then, this monocrystalline silicon layer 12 is doped with N-type impurities by any known method, such as by thermal diffusion or ion implantation. In this manner, the monocrystalline silicon layer 12 is rendered uniformly into the N-type. An insulating layer 41 is then formed on the overall planar surface of the substrate 40, inclusive of the surfaces of the N-type monocrystalline silicon layer 12. The contact hole 44 is then formed, such as by etching, in the N-type monocrystalline silicon layer 12. Then, P-type impurities are introduced by ion implantation into the N-type monocrystalline silicon layer 12 by way of the contact hole 44. At this time, since the regions to be rendered into the P-type are in the form of monocrystalline silicon, in contrast to the conventional practice, the depth d and the width b of the P-type monocrystalline region 15 that is to be formed by addition of impurities can be controlled easily to desired values by adjusting energy for ion implantation and an amount of ions to be implanted, for example, and the pn junction can be produced which has a uniform junction surface and may function as the memory cell without the necessity of substantially increasing the depth d of the P-type monocrystalline region 15. It is therefore possible to provide for the depth d of the P-type monocrystalline region 15 which may be of the order of 1000Å. Since the thickness h of the N-type polysilicon layer 12 is usually of the order of 3000Å, the reduction in the effective cross sectional area of the N-type polysilicon layer 12 caused by the formation of the P-type monocrystalline region 15 may be of the order of 10 to 25%. As a result, the resistance value of the word line in its entirety is not so markedly increased and a sufficient amount of the current may be supplied during data readout to the word line. As a final step, a band-like electrically conductive layer 43 formed, for example, of aluminum, is formed on the insulating layer 41, inclusive of the contact hole 44, as conventionally.

Figure 2:
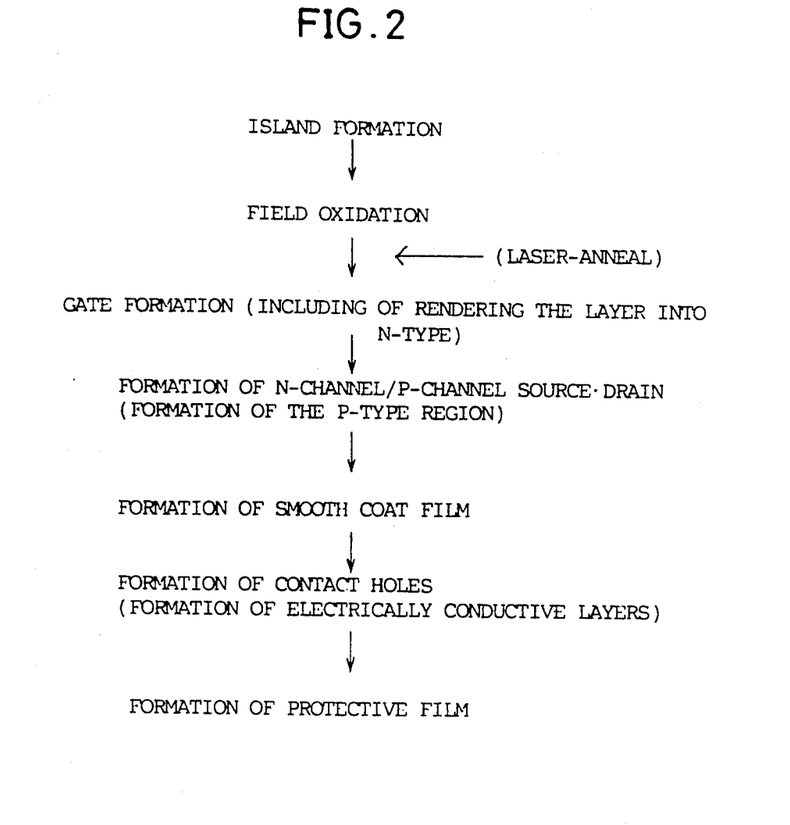
FIG. 2 is a diagrammatic flow chart showing the process for producing the mask ROM according to an embodiment of the present invention.
Figure 3:
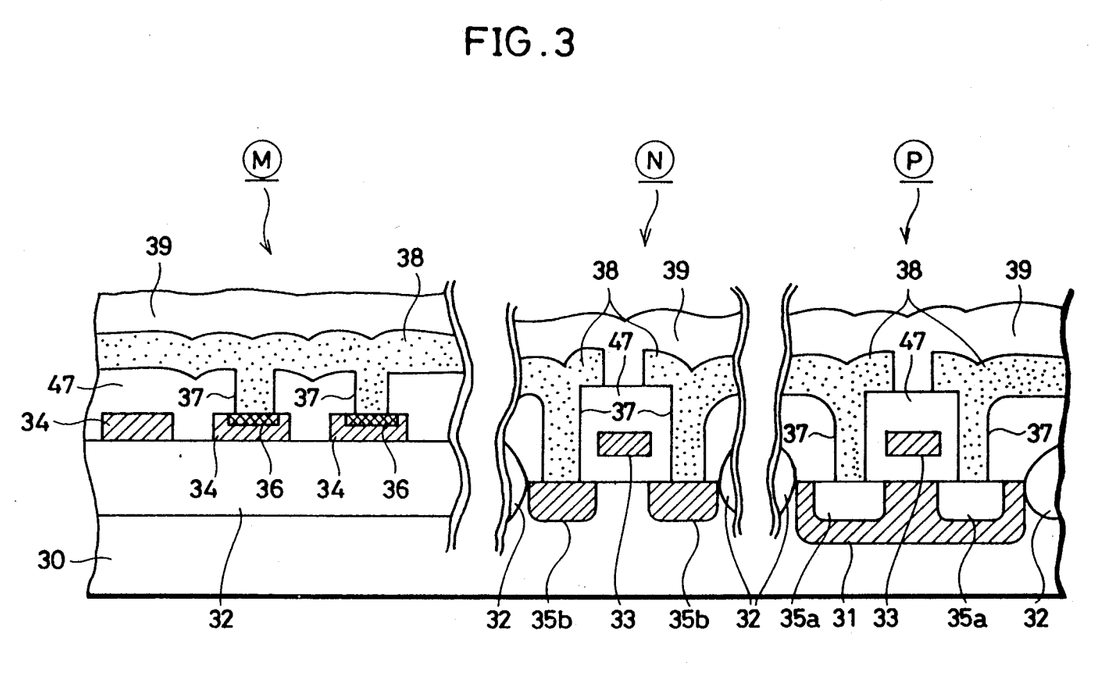
FIG. 3 is a partial cross sectional view showing a mask ROM chip produced by the process shown in FIG. 2.

FIG. 2 is a diagrammatical flowchart for illustrating the manufacture process of the mask ROM chip including a memory cell array and a peripheral circuit for driving the array according to an embodiment of the present invention. Now referring to FIG. 2, the manufacture process for the mask ROM according to the present invention will be explained. Reference is also made to FIGS. 3 and 4 for illustration. FIG. 3 is a partial cross sectional view showing an example of a mask ROM chip obtained by the manufacture process shown in FIG. 2. FIG. 3 also shows typical formation of a P-type transistor and an N-type transistor on the same chip. FIG. 4 shows the manufacture process for the mask ROM chip shown in FIG. 3, concerning the memory part.

First, N-type impurities are selectively diffused on the planar surface of the P-type monocrystalline silicon substrate 30 for forming a N-well region. This step corresponds to the step of "island formation" in FIG. 2.

A field oxide film 32, which is a thicker insulating film, is then formed on the planar surface of the substrate 30. In the memory region M where a memory cell is to be formed, the field oxide film 32 becomes an interlayer insulating film between the memory cell and the substrate 30 (see FIG. 4.). This step corresponds to the step "field oxidation" in FIG. 2.

Then, polysilicon layers 33 and 34 are formed selectively in an N-channel region N where an N-channel transistor is to be formed, a P-channel region P where a P channel transistor is to be formed, and in the memory region M. These polysilicon layers 33 and 34 form a gate polysilicon layer 33 of a transistor in the N-channel region N and in the P-channel region P, while forming parallel band-shaped word line silicon layers 34 in the memory region M. This step corresponds to the step of "gate formation" in FIG. 2. At this time, the parallel plural band-shaped word line silicon layers 34, that is to be the future word lines in the memory region M, are heat-treated with a laser light and thereby monocrystallized (see FIG. 4B).

Then, N-type impurities are selectively introduced by ion implantation into the planar surface in the N-channel region N of the substrate 30 for forming N-type diffusion layers 35b. Furthermore, the portions of the memory region M not provided with contact holes are masked. Thus P-type impurities are selectively introduced by ion implantation into the N-well 31 provided on the planar surface in the P-channel region P of the substrate 30 and into portions of the memory region M where there are to be provided contact holes of the word line silicon layers 34, for simultaneously forming the P-type diffusion layer 35a and a P-type regions 36 (see FIG. 4C). The P-type diffusion layer 35a becomes the source-drain region of the P-channel transistor, while the N-type diffusion layer 35b becomes the source-drain region of the N-channel transistor. Simultaneously, by formation of the P-type region 36, a pn junction is formed in each of the memory cells where there are provided the contact holes of the memory region M (see FIG. 4D). This process corresponds to the step of "formation of N-channel/P-channel source-drain" in FIG. 2. In short, in distinction from the conventional method, the source-drain region of the transistor and the pn junction of the memory cell are formed simultaneously. This is made possible by the fact that the word line silicon layer 34 in which the P-type region 36 is to be formed is previously monocrystallized, so that the target of ion implantation is placed under the same conditions as those for the planar surface of the substrate 30 on which the source-drain of the transistor is to be formed.

Then, for smoothing the irregularities on the substrate 30, an insulating film 47 is formed on the overall surface of the substrate 30 inclusive of the memory region M, N-channel region N and the P-channel region P. This process corresponds to the step of "formation of smooth coat film" in FIG. 2.

Figure 4A:
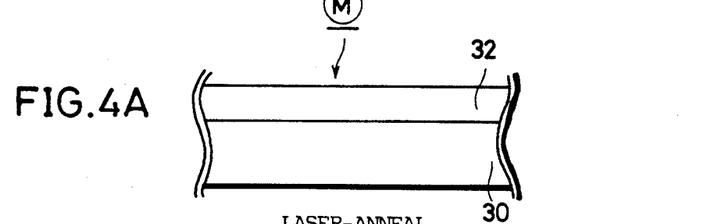
FIGS. 4A to 4E show the production process for producing the memory regions of the mask ROM shown in FIG. 3.
Figure 4B:
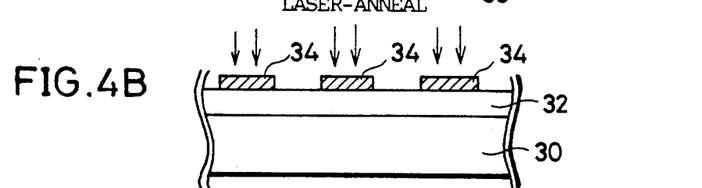
Figure 4C:
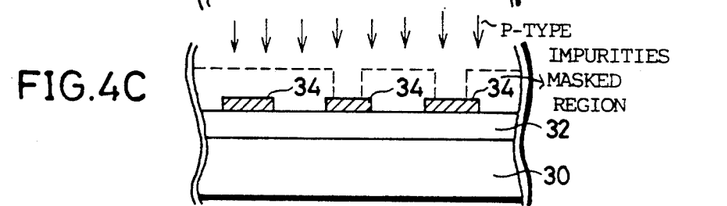
Figure 4D:
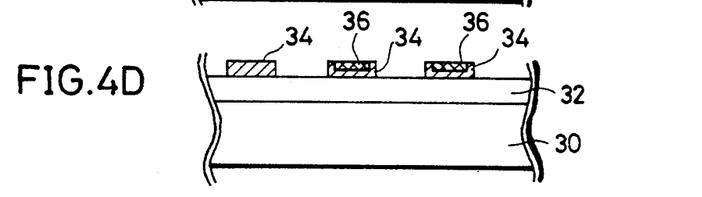
Figure 4E:
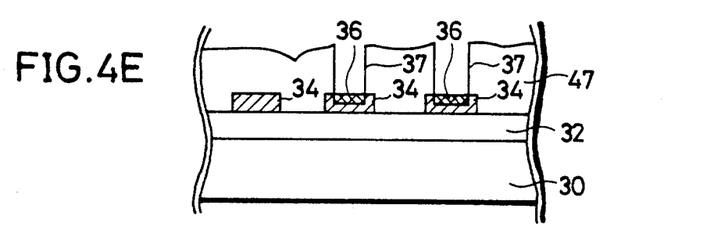

Then, contact holes 37 are etched selectively in the insulating film 47 formed in the preceding step (see FIG. 4E). This step corresponds to the step of "formation of contact holes" in FIG. 2.

Then, an aluminum wiring layer 38 of a desired pattern is formed on the planar surface of the substrate 30 inclusive of the contact holes 37.

As a final step, a glass layer 39 is formed on the overall surface of the substrate 30 inclusive of the memory region M, P-channel region P and N-channel region N, for device protection. This step corresponds to the step of "formation of protective film" in FIG. 2.

In the above described embodiment, for simplification of the step of manufacturing the mask ROM, the doping of the P-type impurities for selectively forming the pn junction in each of the memory cells is carried out in common with the doping for forming the source/drain of the transistor. However, the doping of the P-type impurities for selectively forming the pn junction in the memory cell may of course be carried out in the different step from that of forming the source/drain of the transistor as conventionally. Next, the step of manufacturing the memory part in such a case will be described with reference to FIGS. 5A to 5E, in relation with the entire step of manufacturing the mask ROM shown in FIG. 3. FIGS. 5A to 5E are partial cross sectional views of the memory part illustrating the step of manufacturing the memory part, in such a case.

Figure 5A:
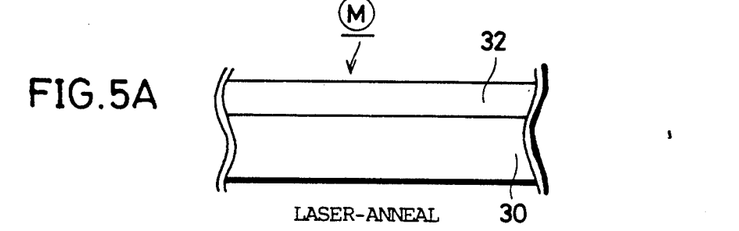
FIGS. 5A to 5E show another production process for producing the memory regions of the mask ROM shown in FIG. 3.
Figure 5B:
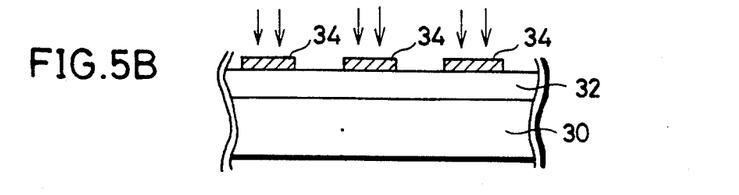
Figure 5C:
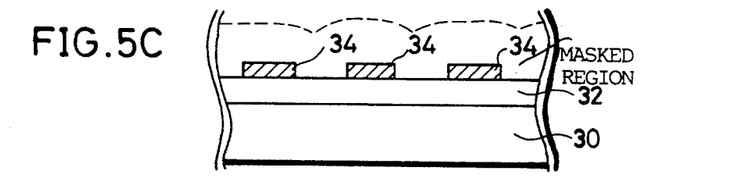

First, after the above steps of "field oxidation" and "gate formation", the interlayer insulating film 32 and the word line silicon layer 34 are formed in the memory region M in FIG. 3 (referred to FIGS. 5A and 5B). Then, the word line silicon layer 34 is heat-treated with a laser light. The steps of manufacturing the memory region M heretofore are the same as in the case with the above described embodiment shown in FIGS. 4A to 4E. However, in the next step of "formation of N-channel/P-channel source-drain", the memory region M is entirely masked (referred to FIG. 5C). Therefore, after completion of this step, the P-type region is not yet formed in the word line silicon layer 34.

Figure 5D:
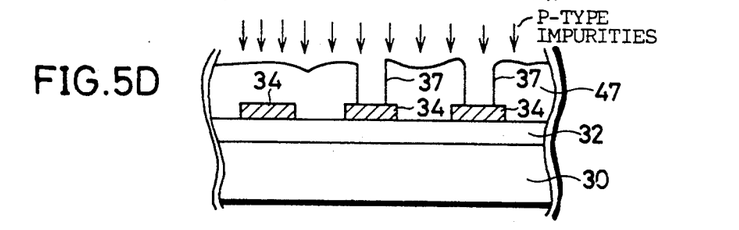
Figure 5E:
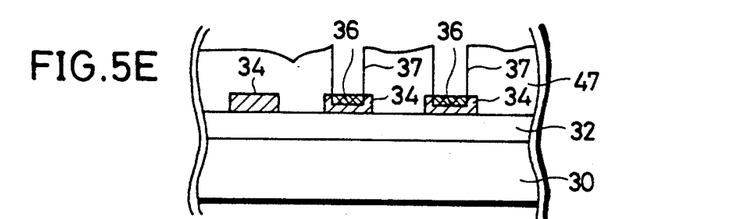

Next, after removing the mask and then going through the steps of "formation of smooth coat film" and "formation of contact holes", the insulating film 47 in which contact holes are selectively formed extending to the word line silicon layer 34 is formed in the memory region M (referred to FIG. 5D). Thereafter, the P-type impurities are introduced by ion implantation into the memory region M, employing the insulating film 47 as a mask. As a result, the pn junction is formed in each of the memory cells in which the contact holes are provided in the memory region M (referred to FIG. 5E). The subsequent steps are the same as in the case with the previous embodiment. In this embodiment, a determination is made which memory cell is to be provided with the contact holes, in a step close to the final step of 20, manufacturing the mask ROM chip. Meanwhile, a pattern of formation of the contact holes varies in accordance with data to be stored in the mask ROM. Accordingly, in respect of a reduction in a period (turn around time) from receiving a designation of the data from the user, i.e., taking an order for manufacturing the mask ROM, to supplying an ordered product to the user, the step of forming the contact holes is preferably close to the final step of manufacturing the mask ROM chip. Therefore, this embodiment is desirable in respect of the reduction in the turn around time.

As described hereinabove, when the mask ROM is produced in accordance with the present invention, the manufacture process may be simplified as compared with the conventional practice, while the pn junction desirable for the memory cell and the word line having a desirable resistance value for practical application may be produced easily. It is noted that the laser-annealing step in the course of the manufacture of the mask ROM is not limited to the above described embodiment, but may be inserted anywhere between the step of forming the polysilicon layer that is to be the word line and the step of rendering this layer into the N-type.

Also, in the above embodiment, the gates of the N-channel and P-channel transistors are formed by polysilicon that is neither the P-type nor of the N-type. However, for lowering the gate resistance of the transistor, the polysilicon that is to be the gate of the transistor may be rendered into the N-type, in which case the step of rendering the polysilicon into the N-type may be performed simultaneously with the step of rendering into the N-type of the monocrystalline silicon forming the word line of the memory region.

Although the present invention has been described an illustrated in detail, it is clearly understood that the same is by way of illustration and example only and is not to be taken by way of limitation, the spirit and scope of the present invention being limited only by the terms of the appended claims.

What is claimed is:

1. A mask-type read only memory comprising:
   a substrate,
   an insulator formed on said substrate,
   a plurality of first conductors formed on said insulator and having at least a layer of monocrystalline silicon of a first conductivity type at a surface thereof which is remote from said substrate, said conductors having a predetermined cross-sectional area,
   an insulator layer formed on said conductors and having contact holes selectively formed therein above selected portions of said conductors, a plurality of second conductors formed above and within said contact holes, and impurity implanted regions of a second impurity type and a concentration sufficient to form pn junctions within said first conductors at least at a lower end of said contact holes, said impurity implanted regions having a width determined by a size of said contact holes and a selected depth, the product of said width and depth being less than a predetermined fraction of said cross-sectional area of said first conductors.

2. An integrated circuit having a mask-type read only memory and a peripheral circuit containing at least one field effect transistor of a first conductivity type channel and having source and drain regions formed in a monocrystalline substrate, said integrated circuit comprising:

a monocrystalline silicon substrate, an insulator formed on a portion of said substrate corresponding to said mask-type read only memory, said mask-type read only memory comprising first and second pluralities of elongated conductors, said first and second pluralities of elongated conductors being respectively disposed at an angle to each other so as to define intersection points and pn junctions disposed between ones of said first and second pluralities of conductors at selected intersections thereof, wherein said first plurality of conductors are disposed on said insulator and each conductor of said first plurality of conductors is formed to include at least a layer of monocrystalline silicon of the same conductivity type as said channel of said field effect transistor at a surface thereof which is remote from said insulator, whereby said pn junctions of said mask-type read only memory and said source and drain regions of said at least one field effect transistor are simultaneously formed by impurity implantation.

3. A mask ROM produced by a method comprising the steps of:

forming a plurality of parallel band-like polysilicon layers on a substrate having a planar surface, laser annealing said polysilicon layer for conversion thereof into monocrystallized layers having surfaces, introducing impurities of a first conductivity type into said monocrystallized layers for forming monocrystalline layers of said first conductivity type, forming an insulator layer on said monocrystalline layers of said first conductivity type, forming openings in regions of said insulator layer in accordance with the information to be stored in the mask ROM, said openings reaching the surfaces of said monocrystalline layers of said first conductivity type, introducing impurities of a second conductivity type of opposite polarity to said first conductivity type through said openings to form regions of said second conductivity type, and forming a plurality of parallel band-like conductive layers in regions of said insulator layer including those regions in which said openings are formed, said conductive layers intersecting said monocrystalline layers of said first conductivity type, said conductive layers connecting to said regions of said second conductivity type in said regions in which said openings are formed.

4. An integrated circuit having a mask-type read only memory and a peripheral circuit containing at least one field effect transistor of a first conductivity type channel and having source and drain regions formed in a monocrystalline substrate, said integrated circuit comprising:

a monocrystalline silicon substrate, an insulator formed on a portion of said substrate corresponding to said mask-type read only memory, said mask-type read only memory comprising first and second pluralities of elongated conductors, said first and second pluralities of elongated conductors being respectively disposed at an angle to each other so as to define intersection points and pn junctions disposed between ones of said first and second pluralities of conductors at selected intersections thereof, wherein said first plurality of conductors are disposed on said insulator and each conductor of said first plurality of conductors is formed to include at least a layer of monocrystalline silicon of the same conductivity type as said channel of said field effect transistor at a surface thereof which is remote from said insulator, wherein said pn junctions of said mask-type read only memory and said source and drain regions of said at least one field effect transistor are simultaneously formed by impurity implantation.

5. An integrated circuit having a mask-type read only memory and a peripheral circuit containing at least one field effect transistor of a first conductivity type channel and having source and drain regions formed in a monocrystalline substrate, said integrated circuit comprising:

a monocrystalline silicon substrate, an insulator formed on a portion of said substrate corresponding to said mask-type read only memory, said mask-type read only memory comprising first and second pluralities of elongated conductors, said first and second pluralities of elongated conductors being respectively disposed at an angle to each other so as to define intersection points and pn junctions disposed between ones of said first and second pluralities of conductors at selected intersections thereof, wherein said first plurality of conductors are disposed on said insulator and each conductor of said first plurality of conductors is formed to include at least a layer of monocrystalline silicon of the same conductivity type as said channel of said field effect transistor at a surface thereof which is remote from said insulator.

* * * * *